(12) United States Patent
Allen et al.

(10) Patent No.: US 7,030,035 B2
(45) Date of Patent: Apr. 18, 2006

(54) PREVENTION OF ELECTROSTATIC WAFER STICKING IN PLASMA DEPOSITION/ETCH TOOLS

(75) Inventors: Donald G. Allen, Morgan Hill, CA (US); Richard Jule Contreras, San Jose, CA (US); Michael Feldbaum, San Jose, CA (US); Dominic Frank Truchetta, Livermore, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 0 days.

(21) Appl. No.: 10/845,651

(22) Filed: May 14, 2004

(65) Prior Publication Data

US 2005/0255705 A1 Nov. 17, 2005

(51) Int. Cl.
*H01L 21/31* (2006.01)
*H01L 21/469* (2006.01)

(52) U.S. Cl. ....................... 438/758; 438/729
(58) Field of Classification Search .............. 438/758, 438/676, 729; 118/728
See application file for complete search history.

(56) References Cited

U.S. PATENT DOCUMENTS

| | | | |
|---|---|---|---|
| 4,786,814 A | 11/1988 | Kolondra et al. | 250/492.2 |
| 5,612,850 A * | 3/1997 | Birang et al. | 361/234 |
| 6,125,025 A | 9/2000 | Howald et al. | 361/234 |
| 6,333,246 B1 | 12/2001 | Narita et al. | 438/584 |
| 2002/0078891 A1 | 6/2002 | Chu et al. | 118/715 |
| 2002/0124867 A1 | 9/2002 | Kim et al. | 134/1.2 |
| 2003/0073278 A1 | 4/2003 | Ohmi et al. | 438/225 |

FOREIGN PATENT DOCUMENTS

JP 2002323513 A 11/2002

* cited by examiner

*Primary Examiner*—Caridad M. Everhart
(74) *Attorney, Agent, or Firm*—Robert O. Guillot; Intellectual Property Law Offices

(57) ABSTRACT

To remove unwanted electrostatic charge from a substrate or substrate clamping mechanism in a plasma processing chamber following the plasma processing of the substrate, the process of shutting down the RF power supply is altered. Specifically, the present invention is a stepped RF power shut down sequence in which the RF power is lowered in a first step from full power to approximately 5 to 10 watts for a short period of time, such as approximately 1 second, and thereafter the RF power is turned off. As a result of this RF power shut down sequence, with its intermediate step, the plasma during the intermediate step acts to neutralize or discharge the electrostatic charge that has built up upon the wafer and/or clamping mechanism during full power operation. When the electrostatic charge has been removed, the wafer sticking problem is resolved.

11 Claims, 1 Drawing Sheet

PREVENTION OF ELECTROSTATIC WAFER STICKING IN PLASMA DEPOSITION/ETCH TOOLS

BACKGROUND OF THE INVENTION

1. Field of the Invention

Figure 1:
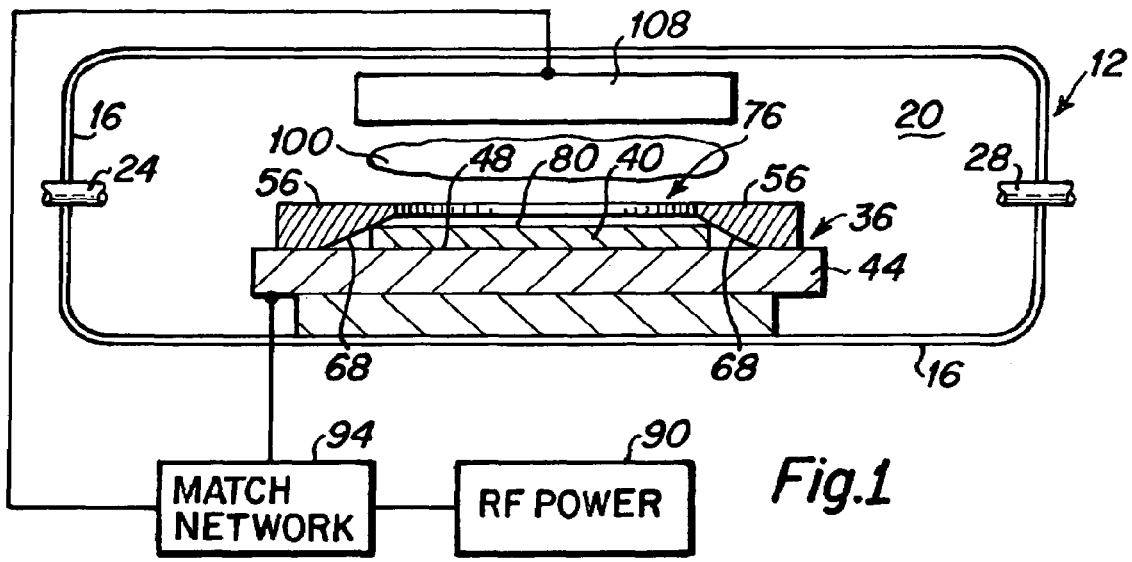

The present invention relates generally to plasma deposition and etch tools, and more particularly to electrostatic sticking of a processed substrate to the substrate stage of such plasma deposition/etch tools.

2. Description of the Prior Art

Magnetic heads for hard disk drives are fabricated in large numbers upon the surface of wafer substrates, and many fabrication steps, utilizing a variety of processing equipment, are involved. Some of the typical processing steps involve the use of plasma deposition tools or plasma etching tools to deposit or remove layers of material from the wafer surface. Such tools include enclosed chambers, typically with reduced atmospheric pressure and high RF voltages, in which the substrate is placed and in which the plasmas are created to interact with the exposed surface of the substrate. It is a common occurrence that unwanted electrostatic charge can build up on the wafer substrate, causing it to electrostatically cling to the wafer mounting mechanism within the chamber. The occurrence of wafer sticking can become a serious problem because it disrupts the automated processing of wafers within the wafer processing equipment. Typically, the equipment must be shut down to allow mechanical intervention to free the stuck wafer. This results in unwanted processing delays in the use of the automated wafer processing equipment and may cause damage to the wafer.

SUMMARY OF THE INVENTION

In typical plasma deposition/etch tools, the processed substrate may become electrostatically stuck to the wafer clamping mechanism, thereby interrupting the automated processing of wafers. In the present invention, to remove the electrostatic charge following the processing of the substrate, the process of shutting down the RF power supply is altered from the prior art shut down sequence. Specifically, the present invention is a stepped RF power shut down procedure in which the RF power is lowered in a first step from full power to approximately 5 to 10 watts. The RF power is maintained at this value for a short period of time, such as approximately 1 second, and thereafter the RF power is turned off. As a result of this RF power shut down sequence, with its intermediate step, the plasma during the intermediate step acts to neutralize or discharge the electrostatic charge that has built up upon the wafer and/or clamping mechanism during full power operation. When the electrostatic charge has been removed, the wafer sticking problem is resolved. As a result, processed wafers no longer stick to the wafer clamping mechanism, and the automatic throughput of the wafer processing equipment is improved.

It is an advantage of the deposition/etch process of the present invention that processed wafers are no longer electrostatically stuck to the wafer clamping mechanism.

It is another advantage of the deposition/etch tool of the present invention that it includes an RF power supply shut down sequence which results in the lessening of the occurrence of electrostatic sticking of the processed wafer to the wafer clamping mechanism.

It is a further advantage of the deposition/etch tool of the present invention that it includes an RF power supply shut down sequence that includes an intermediate power step in which the RF power is reduced from full power to approximately 5 to 10 watts, such that the occurrence of electrostatic sticking of wafer substrates to the clamping mechanism is reduced.

It is yet another advantage of the deposition/etch tool of the present invention that the occurrence of electrostatic sticking of processed wafers to the clamping mechanism is substantially reduced, such that wafer throughput is improved.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

Figure 2:
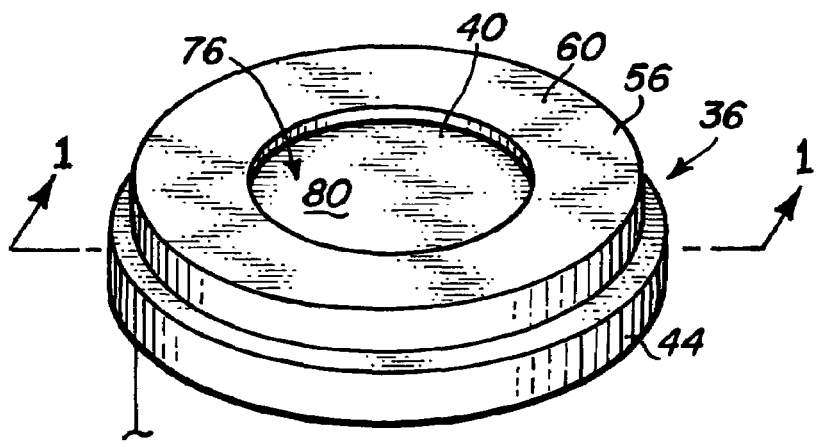

FIG. 1 is a diagram depicting the significant features of a plasma processing chamber, such as might be used in an ion etching process; and FIG. 2 is a top plan view of the wafer clamping mechanism of the plasma processing chamber depicted in FIG. 1, wherein section lines 1—1 show the relationship between FIGS. 2 and 1.

DETAILED DESCRIPTION OF THE PREFERRED EMBODIMENTS

In a typical magnetic head fabrication process upon a wafer substrate, material deposition and etching steps are conducted in a plasma processing chamber, and FIG. 1 is a diagram depicting the significant features of a typical plasma processing chamber 12. As depicted therein, the chamber 12 is defined by walls 16 that form an enclosed chamber space 20. Such a plasma processing chamber 12 may be a component of an automated multi-chamber device (not shown) having automated wafer handling equipment that manipulates the wafers through a series of process steps that occur in the various chambers of the device. A processing gas inlet 24 is formed in a wall 16 of the chamber 12 and a vacuum outlet 28 is also formed in a wall 16 of the chamber. A substrate stage or chuck 36 is disposed within the chamber 12 for holding a wafer substrate 40 during processing. The stage 36 includes a base 44 having an upper surface 48 upon which a wafer substrate 40 to be processed is disposed, and an automated mechanical clamping mechanism 56 is utilized to hold the wafer 40 in position upon the surface 48. Various types of mechanical clamping mechanism exist, and are included within the scope of the present invention. The clamping mechanism 56 depicted in FIGS. 1 and 2 is engaged to the stage base 44 and extends over the stage surface 48. It includes a wafer clamping ring 60 having a beveled lower ring surface 68 for contacting and clamping the edge of the wafer 40 which is installed beneath the clamping ring 60. An opening 76 in the center of the clamping ring 60 provides exposure of the wafer surface 80 to the processing chamber space 20.

A source of RF power 90 is connected through a match network 94 to the wafer stage base 44 for generating a plasma 100 between an upper electrode 108 and the stage base 44 when the processing gas is exposed to the RF field generated by the RF power source. Various RF power devices for generating plasmas for ion etching or deposition are known, and they are intended to be included within the scope of the present invention. The features of the processing chamber, as described thus far, are well known to those skilled in the art, and such prior art processing chamber include many further detailed structures and components, the depiction the description of which is not necessary for understanding the details of the present invention which are described herebelow.

A problem that exists with prior art processing chambers, as described hereabove with the aid of FIGS. 1 and 2, is that the wafer 40 may become stuck to the wafer clamping ring 60 following the completion of processing within the chamber 12. Where the wafer becomes stuck, the automated processing of wafers within the chamber equipment is disrupted, the chamber must be accessed, and the wafer must be manually separated from the wafer clamping mechanism.

It has been determined by the inventors that the reason for the wafer sticking is nearly always caused by electrostatic charge on the wafer 40 and/or wafer clamping mechanism 56 that is created during the wafer processing within the chamber. The electrostatic charge is created by the charged ions and/or electrons of the processing plasma 100. The inventors have developed an additional process step which serves to remove the electrostatic charge following the wafer processing within the chamber, such that the wafer sticking problem has been much reduced.

Returning to FIG. 1, applicant's invention involves the insertion of a power reduction step in the chamber shut down process that is conducted when the RF power is shut off following the wafer processing within the chamber. Specifically, during the wafer processing, a typical RF power of approximately 250 to 700 watts is applied to the chamber components by the RF power supply 90. In the prior art process, following completion of processing, the RF power supply is simply turned down to zero in terminating the process.

In the present invention, the additional step which is conducted is that the RF power is not directly reduced from full processing power down to zero. Rather, an intermediate power reduction step is introduced at the end of the process, wherein the RF power is first reduced from the full processing power of 250 to 700 watts down to approximately five to ten watts. The power at this intermediate step is allowed to remain at this level for a short period of time, such as approximately one second. Thereafter, the RF power is reduced to zero.

It has been found that when the power is reduced in the step sequence just described, that the electrostatic charge buildup on the wafer 40 and/or wafer clamping mechanism 56 is neutralized or discharged by the remaining plasma with the chamber, such that the unwanted electrostatic charge is reduced to a negligible value. As a result, the problem of processed wafers sticking to the wafer clamping mechanism has been reduced to near zero incidence rate. The automated wafer processing equipment then removes the processed wafer and operates without the interruptions that previously occurred due to the electrostatic sticking problem; wafer throughput is improved and the loss of particular wafers that had become electrostatically stuck is minimized.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

The invention claimed is:

1. A method for reducing electrostatic sticking of a processed substrate in a processing chamber, comprising:
   placing a substrate to be processed within a substrate clamping mechanism of a processing chamber;
   creating a plasma within said processing chamber by turning on an RF power supply;
   processing said substrate by exposing a surface thereof to said plasma;
   terminating said processing of said substrate by turning off said RF power by first reducing the RF power to an intermediate power level of approximately 5 to 10 watts;
   allowing the RF power to stay at said intermediate power level for a short time;
   turning said RF power down to zero; and
   removing said substrate from said chamber.

2. A method for reducing electrostatic sticking of a processed substrate as described in claim 1 wherein said short time period is approximately one second.

3. A method for reducing electrostatic sticking of a processed substrate as described in claim 1, wherein said processing chamber comprises a plasma etching chamber.

4. A method for reducing electrostatic sticking of a processed substrate as described in claim 1, wherein said processing chamber comprises a plasma deposition chamber.

5. A method for reducing electrostatic sticking of a processed substrate in a processing chamber, comprising:
   placing a substrate to be processed within a substrate clamping mechanism of a processing chamber;
   creating a plasma within said processing chamber by turning on an RF power supply;
   processing said substrate by exposing a surface thereof to said plasma;
   terminating said processing of said substrate by turning off said RF power by first reducing the RF power to an intermediate power level of approximately 5 to 10 watts;
   neutralizing an electrostatic charge that exists on said substrate by exposure of said substrate to said plasma at said intermediate power level;
   turning said RF power down to zero following said intermediate power level step; and
   removing said substrate from said chamber.

6. A method for reducing electrostatic sticking of a processed substrate as described in claim 5 wherein said intermediate power step is conducted for a time period of approximately 1 second.

7. A method for reducing electrostatic sticking of a processed substrate as described in claim 5, wherein said processing chamber comprises a plasma etching chamber.

8. A method for reducing electrostatic sticking of a processed substrate as described in claim 5, wherein said processing chamber comprises a plasma deposition chamber.

9. A method for reducing electrostatic sticking of a processed substrate in a processing chamber, comprising:
   placing a substrate to be processed within a substrate clamping mechanism of a processing chamber;

creating a plasma within said processing chamber by turning on an RF power supply;

processing said substrate by exposing a surface thereof to said plasma;

terminating said processing of said substrate by turning off said RF power by first reducing the RF power to an intermediate power level of approximately 5 to 10 watts;

discharging an electrostatic charge that exists on said substrate by exposure of said substrate to said plasma at said intermediate power level for a time period of approximately 1 second;

turning said RF power down to zero following said intermediate power level step; and removing said substrate from said chamber.

10. A method for reducing electrostatic sticking of a processed substrate as described in claim 9, wherein said processing chamber comprises a plasma etching chamber.

11. A method for reducing electrostatic sticking of a processed substrate as described in claim 9, wherein said processing chamber comprises a plasma deposition chamber.

* * * * *